United States Patent [19]
Jacob

[11] 4,028,155
[45] June 7, 1977

[54] PROCESS AND MATERIAL FOR MANUFACTURING THIN FILM INTEGRATED CIRCUITS

[75] Inventor: Adir Jacob, Framingham, Mass.

[73] Assignee: LFE Corporation, Waltham, Mass.

[22] Filed: Aug. 10, 1976

[21] Appl. No.: 713,128

Related U.S. Application Data

[63] Continuation-in-part of Ser. No. 446,667, Feb. 28, 1974, abandoned.

[52] U.S. Cl. .............................. 156/643; 252/79.1; 156/345; 156/659
[51] Int. Cl.² ...................................... B29C 17/08
[58] Field of Search ................. 156/2, 3, 8, 13, 17, 156/345; 204/164, 170, 192 E, 298; 252/79.1; 131/1

[56] References Cited

UNITED STATES PATENTS

| | | | |
|---|---|---|---|
| 3,615,956 | 10/1971 | Irving et al. | 156/17 |
| 3,880,684 | 4/1975 | Abe | 156/8 |
| 3,908,041 | 9/1975 | Engl et al. | 156/4 X |
| 3,923,568 | 12/1975 | Bersin | 156/8 |

*Primary Examiner*—William A. Powell
*Attorney, Agent, or Firm*—Kenway & Jenney

[57] ABSTRACT

A process step for use in the manufacture of thin film integrated circuits, to enable, in one process, the removal of all the photoresist material from underlying metallic films without concomitant degradation of the metallic surface and in another process, preferential etching of silicon nitrides and oxides without significant simultaneous etching of single crystal silicon. The material is exposed to a low pressure (few torr) rf generated "cold" plasma, where the plasma is a homogeneous gaseous mixture of oxygen, a halogen containing compound and a noble gas.

54 Claims, 6 Drawing Figures

PROCESS AND MATERIAL FOR MANUFACTURING THIN FILM INTEGRATED CIRCUITS

CROSS REFERENCE TO RELATED APPLICATION

This application is a continuation-in-part of application Ser. No. 446,667 entitled "Process And Material For Manufacturing Thin Film Integrated Circuits", filed on Feb. 28, 1974, now abandoned.

FIELD OF THE INVENTION

This invention relates in general to a process and material useful in analytical procedures, and more particularly to a process and material useful in the manufacture of power semiconductor integrated circuits where a plasma discharge through air is unacceptable enabling the removal of photoresist films from underlying, prone to oxidation, metallic films during the processing of such devices. The process and material also provide for preferential etching of silicon oxides and silicon nitrides in comparison to the etching of single crystal silicon.

BACKGROUND OF THE INVENTION

In one conventional technique for the manufacture of thin film integrated circuits, a relatively thin layer, typically 5,000 to 10,000A of patterned dielectric film is deposited on a slice of semiconductor material (p or n-type) to define those areas on the semiconductor slice where it is desired to generate semiconductor junctions. Typically, after diffusion of dopant material into the areas of the semiconductor slice (where there is no dielectric barrier) aluminum metal is vapor deposited over the entire surface area, followed by its patterning to establish ohmic contacts with the preselected semiconductor junctions. Subsequently a critical metal like copper or nickle is sputtered or vapor deposited over the entire surface area for the purpose of covering the exact underlying areas preliminarily covered by the aluminum layer. This operation requires precision photoresist masking followed by acid etching of the copper or nickel from undesired areas, subsequently followed by the removal of the ramainder of the photoresist from the metal covered by it. In the prior art this photoresist stripping is accomplished by means of a digesting solvent that finitely oxidizes or degrades the underlying metal. It is to this metallic surface that high quality connecting leads are attached to enable contact with the outside world.

One of the difficulties associated with this particular technique arises from the inability to strip the residual masking photoresist without concomitant oxidation or degradation of the underlying metallic film. The utilization of wet photoresist strippers requires a post wet chemical treatment to restore oxide-free metallic surfaces; these reductants are of no practical value where chemical or physical degradation of the metal occurred, since any such phenomenon will manifest itself as variable surface conductivity yielding a faulty operation of the resultant integrated circuit. Additional drawbacks of the wet chemical approach involve, the contamination of the various solvents and their associated short shelf life, as well as the continuing cost coupled with their use and the inconvenience in rinsing and drying handling procedures prior to the diffusion step, the latter factor being one that ultimately reduces production yields.

SUMMARY OF THE INVENTION

The process of the present invention employs a gas mixture for the generation of a low pressure plasma having unique characteristics which not only decomposes and volatilizes the residual organic photoresist material, but which also simultaneously effects only an insignificant oxidation or degradation of underlying metallic layers. This same gas mixture can be employed to etch silicon oxides and silicon nitrides preferentially with respect to etching of single crystal silicon. The plasma formed from this particular gas mixture also enables a sequential, different, plasma treatment to practically eliminate any undesirable residues of metal oxides that may have formed during the initial photoresist stripping step.

It has been discovered that if the generated plasma includes not only relatively low concentrations of active oxygen, but also reactive species resulting from an organohalide that includes, as the substituted halogen, a predominance of fluorine in a matrix of a noble gas carrier, the photoresist material will be removed with negligible adverse attack on underlying metallic films. It is believed that the process is one in which very reactive mixed oxyhalide radicals promote the preferential fragmentation and volatilization of photoresist material at prevailing relatively low concentrations of oxygen gas. The utilized, initially low, partical pressures of oxygen in a matrix of a noble gas diluent, coupled with its competitive reactions with organohalide radicals practically reduce the attack of oxygen on metallic films to insignificant levels. The generation of detrimental hot spots on the metallic surface associated with high sustaining ambient reaction temperatures (that could catalyze metal oxidation) is reduced by utilization of a noble gas matrix characterized by high heat conductivity and heat transfer properites. Furthermore, the utilization of a noble gas in the plasma state may include favorable energy transfer processes. These processes, which are predominantly the result of biomolecular collisions of the excited noble gas entities with either the substrate material or the other gaseous atoms, molecules, or free radicals may facilitate a variety of desirable chemical conversions while simultaneously inhibiting the overall diffusion of active species to the solid surface, thereby reducing undesirable and destructive oxidation reactions per unit time. It has also been discovered that a plasma medium including these same gaseous components employed at pressures from 0.5 to 2 torr, operated at power levels from about 100 to 350 watts, provides etching of silicon oxides and nitrides in preference to etching of single cyrstal silicon.

While a number of mixtures have exhibited acceptable operating characteristics for these processes, a preferred mixture for removal of photoresist material from underlying, prone to oxidation, metallic surfaces, appears to be a 94%–6%, by volume, binary mixture of helium-oxygen, respectively, to which 3% of tetrafluoromethane by volume was added to form a homogeneous ternary gaseous mixture. The preferred mixture for the preferential etching of silicon oxides and nitrides is a ternary mixture formed of a 0.5% $O_2$–99.5% binary mixture to which 3% $CF_4$ has been added. However, acceptable mixtures for this purpose can be formed where the $O_2$ lies between 0.25 and 6% of the mixture, $CF_4$ constitutes 0.5 to 7% of the mixture and the balance is one of the group of noble gases including helium, argon or nitrogen, neon or xenon. Multi-component mixtures in which mixed organohalides (e.g., tetrafloromethane -trifluoromethane) or mixed organohalides-inorganic halides (e.g., tetrafluoromethane-fluorine or tetrafluoromethane-trifluoromethane -fluorine) were used also seemed effective for photoresist removal provided the overall volume percent of the mixed gaseous halides remained below 20%. In general, the organohalide must exhibit substantial vapor pressure at room temperature and should have no more than two carbon atoms per molecule. The substituted halogens should include a predominance of fluorine atoms around the central carbon atom. The noble gas carrier should be selected from the series, helium, argon, neon, etc., but distinct effectiveness is associated with the lower molecular weight members.

DESCRIPTION OF PREFERRED EMBODIMENTS

Figures 1, 2:
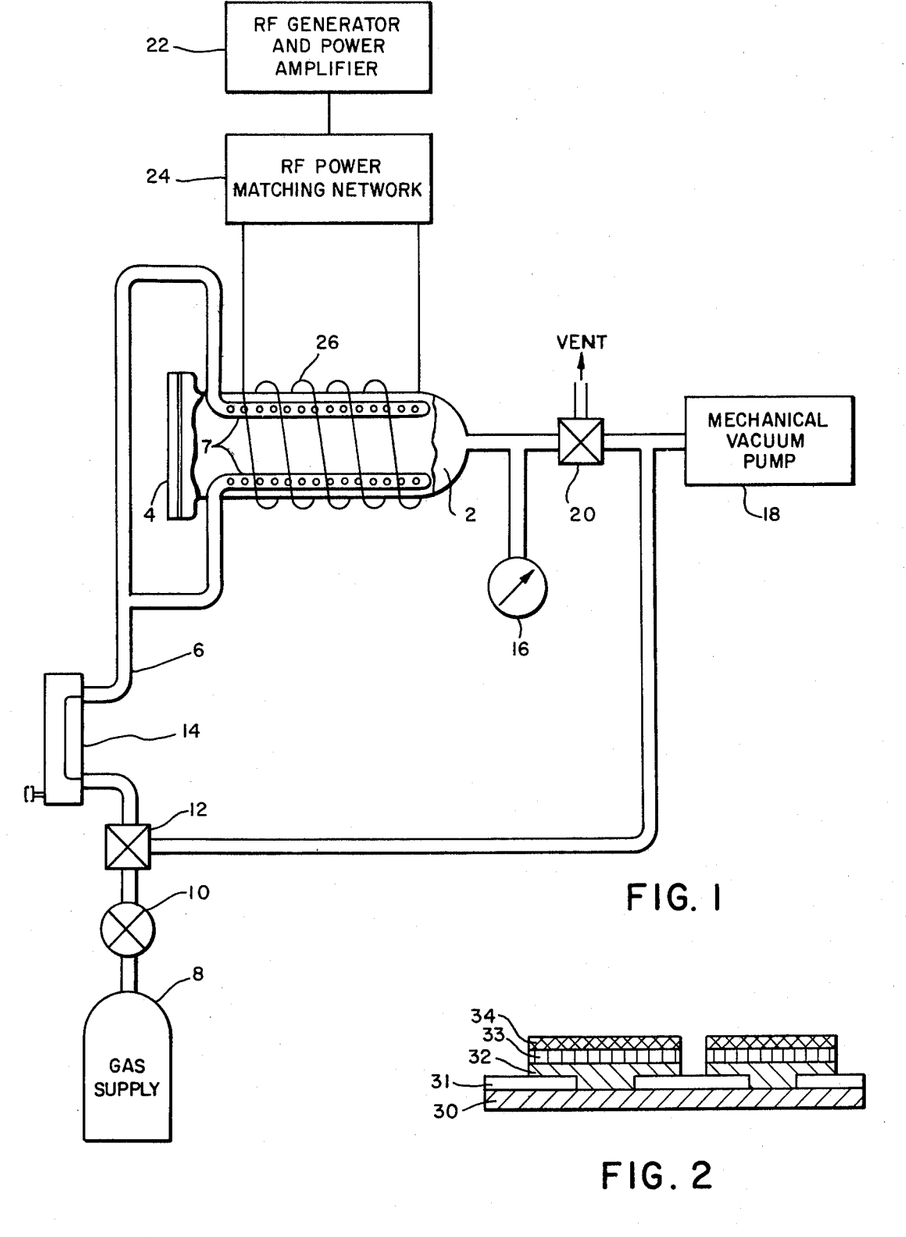
FIG. 1 is an illustration in diagrammatic form of a reactor system useful in the process of this invention.
FIG. 2 is an illustration in cross-sectional view of a typical thin film sturcture at an intermediate stage of the manufacturing process.
Figure 3:
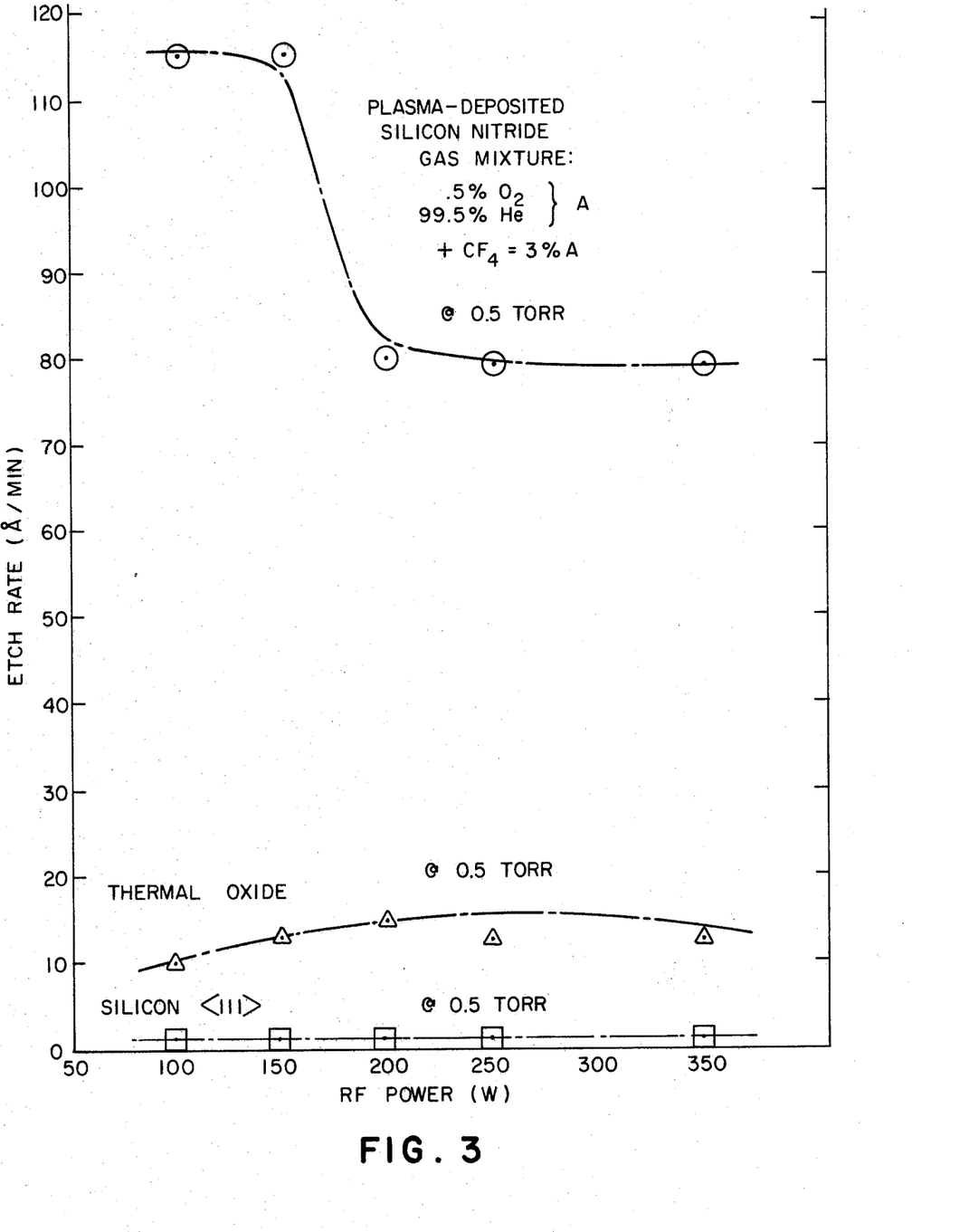
FIG. 3 is an illustration in graphical form of the variation in etch rate of silicon nitride, silicon oxide and single crystal silicon as a function of RF power at 0.5 torr.
Figure 4:
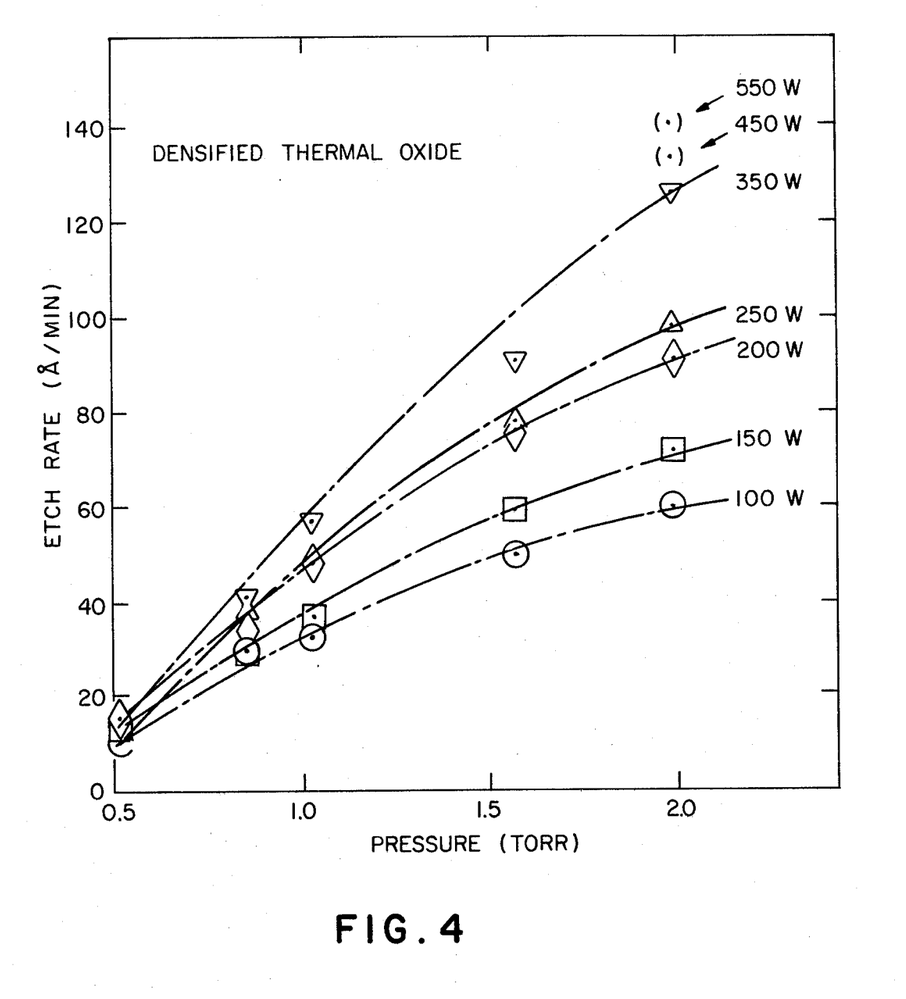
FIG. 4 is an illustration in graphical form of the variation in etch rate of thermal silicon oxide as a function of pressure for different RF power levels.
Figure 5:
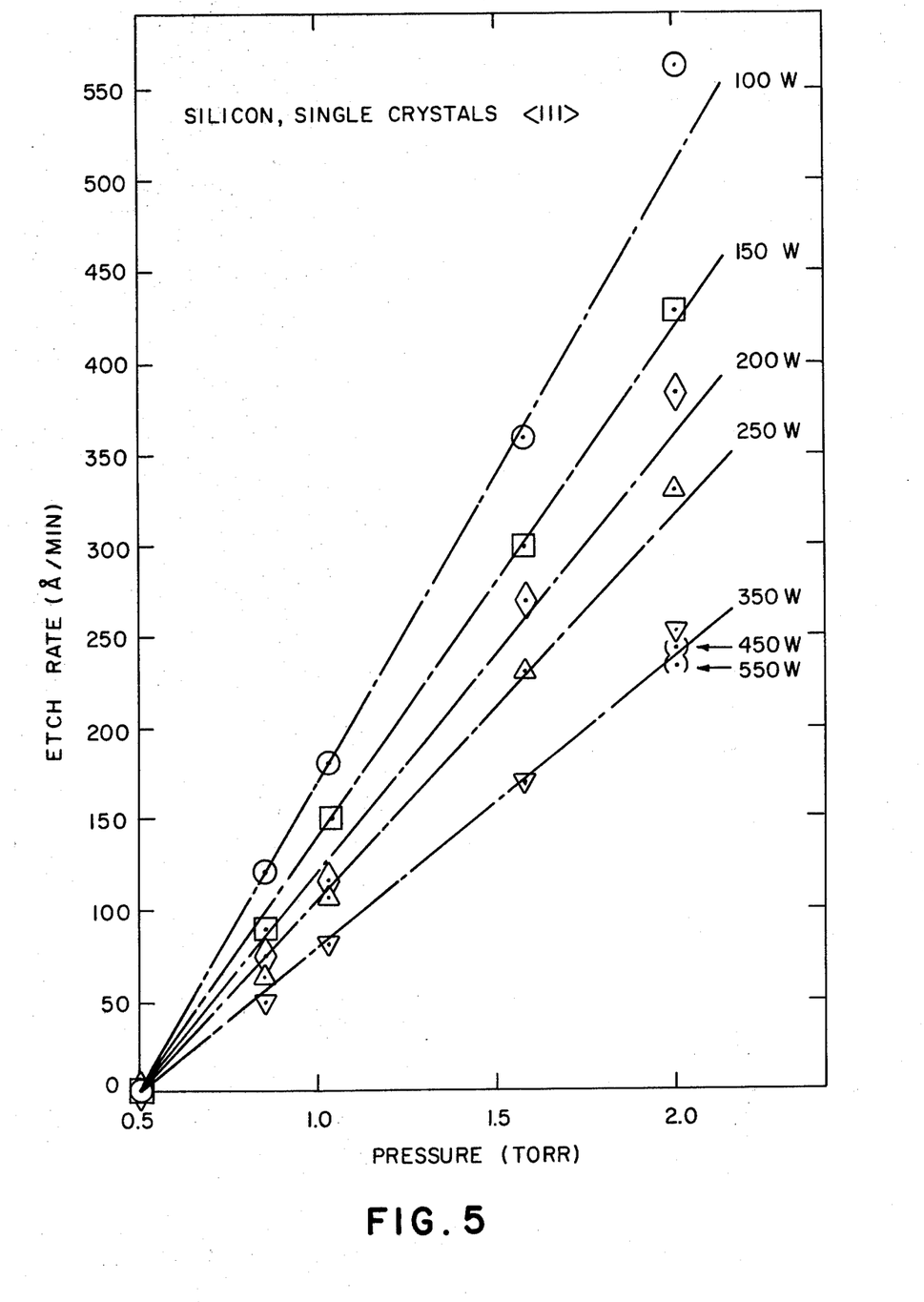
FIG. 5 is an illustration in graphic form of the variation in etch rate of single crystal silicons as a function of pressure for different RF power levels.
Figure 6:
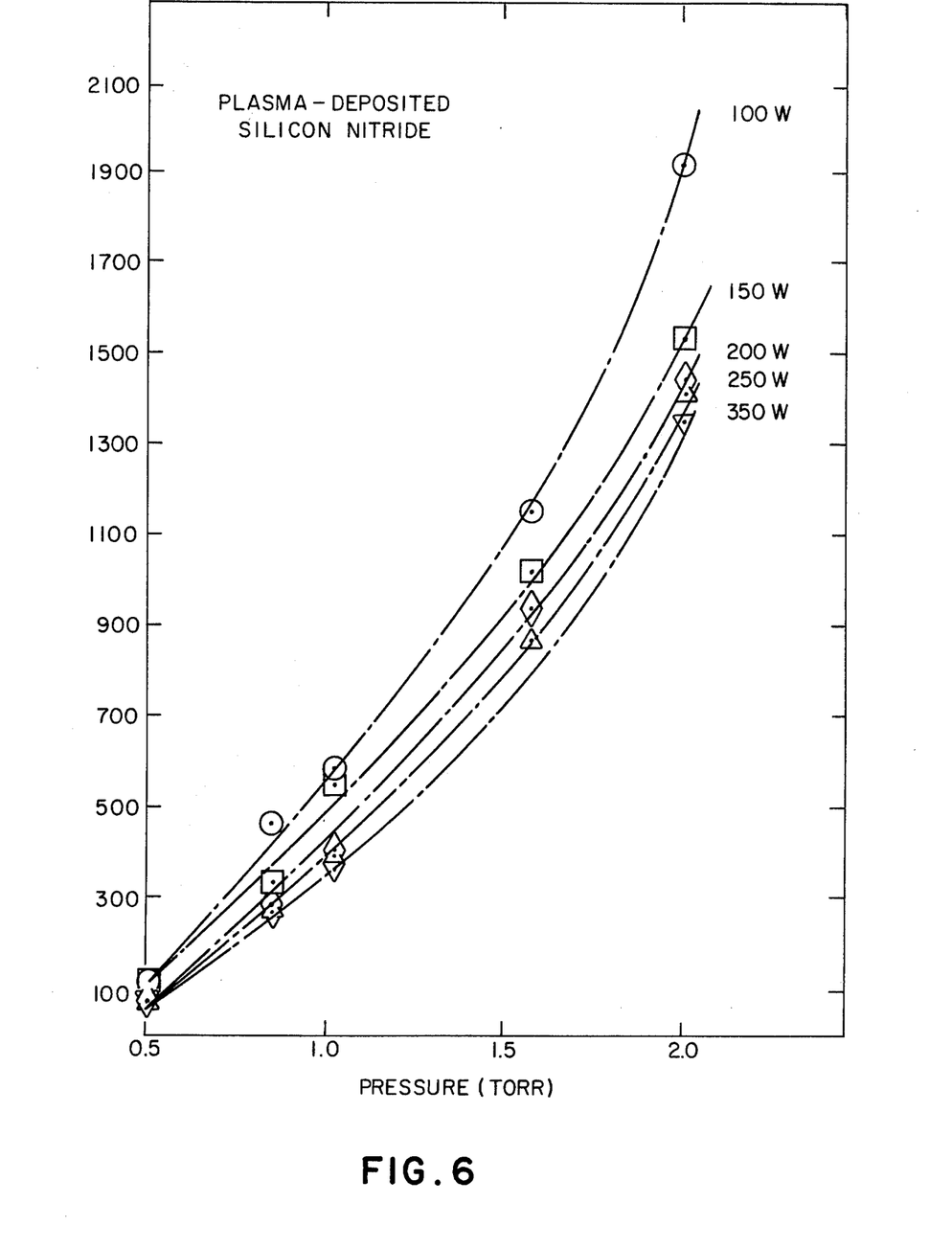
FIG. 6 is an illustration in graphical form of the variation in etch rate of silicon nitride as a function of pressure for different RF power levels.

FIG. 1 depicts diagrammatically an apparatus for use in performing the process described in the invention. The apparatus includes a glass reaction chamber 2, typically made of quartz, having a cover 4 and provided with a gas inlet manifold 6. The side of the reactor 2 has been partically broken away in the drawing so as to better illustrate the gas diffusion tubes 7 which are disposed therein and are externally connected to manifold 6. A pressurized gas supply 8 is connected through a pressure regulating valve 10 and flowmeter 14 to manifold 6. A vacuum gauge 16 provides an indication of total reaction pressure in reactor 2. A source of radio frequency power 22 is coupled through a matching network 24 to inductance 26 surrounding the reaction chamber 2.

In operation, the gaseous mixture comprised of oxygen, organo-halide, and noble gas is admitted to reaction chamber 2, where the inductively coupled radio-frequency energy creates a "cold" plasma. The material to be processed is placed within reactor 2, where it is exposed to the plasma. Such a reaction chamber is commercially available from the Process Control Division of LFE Corporation, under the trade designation DS-302AQ or DS-504AQ. Typically, the rf power per reactor is between 150 to 250W continuous radiation at 13.5 MHz.

The general process is one in which substrate wafers at an appropriate stage of the manufacturing process are placed in reactor 2 and exposed to the plasma generated by the admission of an appropriate gaseous mixture of oxygen, a halogen gas, or halogen compound gas and an inert gas. For the appropriate reactions to take place, and in order to provide an effective process, it is important that this homogeneous mixture be formed prior to its entering the reaction chamber so that prescribed competitive-consecutive action will take place when the rf discharge strikes.

In FIG. 2 there is shown in cross-sectional view, a portion of a thin film integrated circuit at a suitable processing stage for the utilization of this invention. The semiconductor substrate 30 having a relatively thin (2,000 to 10,000A layer of dielectric 31 on its upper surface, would usually be silicon covered partially with a silicon dioxide film serving as a diffusion barrier, although other semiconductor materials may either have a deposited silicon dioxide film, silicon nitride film or another pasivation film deposited onto them. This dielectric layer 31 has been patterned to accommodate an aluminum metallization layer 32 that subsequently accepts a vapor deposited or sputtered metallic layer 33 of copper or nickel on to it through corresponding openings in the overlying photoresist layer 34. At this stage of the process, it is necessary to remove the photoresist layer 34 without adversely oxidizing or degrading the critical metal 33 covered by it.

If the thin film structure, as depicted in FIG. 2, is exposed to the prescribed plasma formed from a gaseous mixture of oxygen, an organohalide, and a noble gas, the photoresist material 34 will be removed without simultaneous degradation or oxidation of the underlying metallic film 33. It has been found that an effective organohalide should be selected from halocarbons having no more than two carbon atoms per molecule, and in which the central carbon atoms are attached to a predominance of fluorine atoms. The gaseous volume percentage of the oxygen gas and the halocarbon component should preferably be below 10% each, with the noble gas carrier making up the balance. The preferred gaseous mixture is produced from a binary mixture containing 6% by volume of oxygen and 9% helium to which 3% by volume of tetrafluoromethane gas is added. In practice, this mixture is supplied from one container, but in principle could be supplied from three independent pressurized sources. However, satisfactory results were achieved with gaseous mixtures in which the volume percent of oxygen was lower and that of tetrafluoromethane higher. In general, for the compounds in the aforementioned group, an increase in the number of carbons atoms per molecule tends to slow down the provess of potoresist stripping and simultaneously enhance the oxidation of the underlying critical metallic layer, while an increase in the mole fraction of the oxygen gas tends to result in excessive oxidation of the metal 33. Too little halocarbon, however, may result also in permitting oxidation of the exposed metallic surfaces.

The successful operation of this process is believed to include competitive reactions in the generated plasma such that the presence of halogen atoms and halogen atom-containing free radicals reduces the net concentration of active oxygen, thus suppressing oxide growth on exposed metallic areas. The correspondingly anticipated decrease in photoresist stripping due to reduction of active oxygen is apparently overcompensated by photoresist fragmentation and volatilization by oxyhalide species. The smallest residual metal oxide contamination that may be left on the metallic surface 33 after the stripping of the photoresist layer 34 may be removed in sequential plasma-based reducing step utilizing rf discharged hydrogen gas or its binary mixtures with other gases; e.g., helium, argon, etc.

It has been found that the mixtures set forth below in the examples within the range of mixture composition as designated, produce acceptable results in the photoresist removal process described.

etching of the silicon surface did not pit the surface for total removal of up to 5 microns of silicon.

The variation of $SiO_2$ etch rate as a function of varying percentages of oxygen portion in a mixture with helium for a fixed $CF_4$ content is illustrated in Table II. In Table II the pressure was 1.6 torr and the RF power was 300 watts.

In Table III the $SiO_2$ etch rates as a function of varying percentages of $CF_4$ in a 4% $O_2$–96% helium mixture

Example I

Based on Binary Mixture of He—$O_2$:

| Binary Mixture Expressed as Volume % of Oxygen Gas (%) | Ternary Mixture Expressed As Added Volume % of Gaseous Tetrafluoromethane to a Binary Mixture of He—$O_2$ (%) | Ternary Mixture Expressed As Added Volume % of Gaseous Trifluoromethane to a Binary Mixture of He—$O_2$ (%) | Ternary Mixture Expressed As Added Volume % of Gaseous Fluorine to a Binary Mixture of He—$O_2$ (%) |
|---|---|---|---|
| 1 | 3 | — | — |
| 3 | 2 | — | — |
| 3 | 6 | — | — |
| 6 | 3 | — | — |
| 6 | 6 | — | — |
| 3 | — | 3 | — |
| 3 | — | 6 | — |
| 6 | — | 3 | — |
| 3 | — | — | 1 |
| 3 | — | — | 3 |
| 6 | — | — | 3 |
| 6 | 2 | 1 | — |
| 6 | 2 | 1 | 1 |

Example II

Based on Binary Mixture of Ar—$O_2$:

| Binary Mixture Expressed as Volume % of Oxygen Gas (%) | Ternary Mixture Expressed As Added Volume % of Gaseous Tetrafluoromethane to a Binary Mixture of Ar—$O_2$ (%) | Ternary Mixture Expressed As Added Volume % of Gaseous Trifluoromethane to a Binary Mixture of Ar—$O_2$ (%) | Ternary Mixture Expressed As Added Volume % of Gaseous Fluorine to a Binary Mixture of Ar—$O_2$ (%) |
|---|---|---|---|
| 3 | 3 | — | — |
| 6 | 3 | — | — |
| 6 | 2 | 2 | 2 |
| 6 | 6 | — | — |
| 6 | 2 | 2 | — |
| 3 | — | 3 | — |
| 3 | — | 6 | — |
| 6 | — | 3 | — |
| 3 | — | — | 2 |
| 6 | — | — | 3 |
| 6 | — | — | 6 |

Mixtures of these same gaseous components can be utilized to preferentially etch the silicon oxide film or nitride film under conditions where the etch rate for the single crystal silicon itself may be extremely low, even substantially zero. The acceptable gas mixtures for this preferential etching includes a binary mixture of 0.25 to 6% $O_2$, 94–99.75% inert gas preferably selected from the group including helium, argon, neon, xeon, and nitrogen, to which is added $CF_4$ in the amount of 3% of the binary mixture.

The selective etching can take place at relatively low pressures, typically in a range from 0.25 to 2 torr over an rf power range from 100 to 350 watts.

The preferred gas mixture is a binary mixture consisting of 0.5% $O_2$ and 99.5% inert gas, such as helium, to which is added $CF_4$ in an amount equal to 3% of the binary mixture. Table I is illustrative of the selective etch rates for silicon, silicon oxide, and silicon nitride for this preferred gas mixture over particular ranges of pressue and RF power. Utilizing this gas in a plasma etching process for a duration as long as 30 to 45 minutes at several hundred watts of rf power caused no degradation of the photoresist etching mask. Where the etching was run at conditions, as illustrated in Table I, where the silicon itself was etched, this deliberate overis illustrated, again at a pressure of 1.6 torr and an RF power level of 300 watts.

In Table IV there is illustrated the dependence of etch rate for single cyrstal silicon on variation of oxygen percentages in its mixture with helium for fixed $CF_4$ content. The pressure for example was 0.5 torr at a RF power level o 150 watts.

In Table V there is illustrated variation of single cyrstal silicon etch rate and silicon oxide etch rate with variations in the most abundant gas components. Average etch rates for argon and nitrogen gases are indicated. The curves of FIGS. 3, 4, 5 and 6 illustrate the variation of etch rates for silicon oxide, silicon nitride, and single crystal silicon, both as a function of RF power and pressure. As is apparent from these curves, etch rates for single crystal silicon and silicon nitride conform substantially to the same RF power-pressure relationship with higher absolute values for the nitride. Average etch rates are the highest for the highest pressures in the range 0.5 to 2 torr but for the lowest RF power levels in the range 100 to 350 watts.

Etch rates for thermally grown slicon oxide, however, follow a reverse trend with RF power input. A monotonous enhancement in etch rages is observed with increasing reaction chamber pressure and RF power to an upper limit to about 150A per minute at 550 watts RF power. The best selectivity and relative etch rate discrimination, at lowest absolute average etch rates for silicon, are therefore obtained with the lowest reaction pressures (e.g., up to one torr) and at elevated RF power levels.

While all the mechanisms involved are not completely identified, it is believed that the basis of the selective etching process is a complex chemical reaction between RF discharged halocarbons in the inert gas matrix with the silicon-containing compounds by virtue of transfer of energy during collisions of the second kind. The absorption of energy by the monatomic inert gas (for example, helium) in the electric discharge leads to electronic transitions of a few electron volts, corresponding in many cases to ionization. The resulting created metastables transfer energy to the polyatomic halocarbons (for example $CF_4$) thereby producing metastable electronic states (for example triplet halocarbon excited molecules) which undergo secondary reactions with silicon containing compounds leading to their etching.

These interactions become more important at lower temperatures and lower pressures at relatively low RF power levels, where atomic reactive species concentrations may be extremely low. Polyatomic molecules quench the electronically excited atoms more efficiently than do the inert gases because the former are chemically more reactive than the latter. Such energy transfers have a high probability of taking place because of the chemical complex formation, and halocarbons such as $CF_4$ seem exceptional in having electronically excited states of lower energy than the excited inert gas atoms.

Since the electronically excited halocarbon entities may require a large number of gas kinetic collisions for deactivation by monatomic species, there may exist reactions of the second kind with the polyatomic silicon oxide and silicon nitride, which lead to their etching; but none with the elemental silicon which may undergo etching reactions almost predominantly by atomic or free radical species.

TABLE I

Etch Rates As A Function of Variation in Pressure and RF Power

| MATL. | PRESSURE (TORR) | RF POWER (W) | ETCH RATE (A/Min |
|---|---|---|---|
| Si | 0.5 | 250 | 0 |
| $SiO_x$ | | | 15 |
| $SiN_y$ | | | 80 |
| Si | 0.65 | 350 | 21 |
| $SiO_x$ | | | 27 |
| $SiN_y$ | | | 140 |
| Si | 0.8 | 350 | 40 |
| $SiO_x$ | | | 40 |
| $SiN_y$ | | | 230 |

Gas mixture is .5% $O_2$, 99.5% He binary mixture + 3% $CF_4$.

TABLE II

Th.$SiO_2$ Etch Rate (A/Min) at 1.6 torr at 300W As A Function of [$O_2$]

| No. | $O_2$(%) | He(%) | $CF_4$(%) | Th. $SiO_2$ Etch Rate (A/Min) |
|---|---|---|---|---|
| 1. | 0 | 97 | 3 | 0 |
| 2. | 0.25 | 99.75 | 3 | 165 |
| 3. | 0.5 | 99.5 | 3 | 130** |
| 4. | 1 | 99 | 3 | 140 |

TABLE II-continued

Th.$SiO_2$ Etch Rate (A/Min) at 1.6 torr at 300W As A Function of [$O_2$]

| No. | $O_2$(%) | He(%) | $CF_4$(%) | Th. $SiO_2$ Etch Rate (A/Min) |
|---|---|---|---|---|
| 5. | 2 | 98 | 3 | 110* |
| 6. | 4 | 96 | 3 | 200* |

*Photoresist mask totally degraded within a few minutes.
**Etching overexposure (after total removal of $SiO_2$) of bare silicon, resulted in less attack (pitting) of Si than in (2) and (4). Also, less photoresist degradation noted here compared to (2) and (4) with over-etching time.

TABLE III

Th.$SiO_2$ Etch Rate at 1.6 torr at 300W As a Function of [$CF_4$]

| No. | $O_2$(%) | He (%) | $CF_4$(%) | Th.$SiO_2$ Etch Rate (A/min) | Si Etch Rate |
|---|---|---|---|---|---|
| 1. | 4 | 96 | 0.5 | 0 | |
| 2. | 4 | 96 | 1.5 | 100 | INCREASES |
| 3. | 4 | 96 | 3 | 200* | |

*Resist mask totally degraded in a few minutes. Finite attack detected in (2) after a few minutes.

TABLE IV

Single Crystal Silicon Etch Rate a 0.5 torr a 150 W As a function of [$O_2$]

| No. | $O_2$(%) | He(%) | $CF_4$(%) | Si Etch Rate (A/Min) |
|---|---|---|---|---|
| 1. | 0.5 | 99.5 | 3 | 0 |
| 2. | 0.75 | 99.25 | 3 | 30 |
| 3. | 1 | 99 | 3 | 70 |
| 4. | 2 | 98 | 3 | 90* |

*Photoresist mask totally degraded within a few minutes.

TABLE V

Etch rates as function of different inert gases*

| Gas Mixture | | | |
|---|---|---|---|
| 1. .5% $O_2$ / 99.5% Ar | Component A | 260A/min. | 80A/min. |
| +$CF_4$ = 3% | Component A | | |
| **2. .5% $O_2$ / 99.5%$N_2$ | Component A | 0 A/min. | 40A/min. |
| +$CF_4$ = 3% | Component A | | |
| **3. 1%$O_2$ / 99%$N_2$ | Component A | — | 50A/min. |
| +$CF_4$ = 3% | Component A | — | |

*Pressure 1.6 torr a power level 350 watts.
**Under these conditions finite degradation of the organic photoresist mask took place. However, these conditions may be beneficial where a different mask is employed with thicker organic or different material.

I claim:
1. A process for use in the manufacture of multi-layer thin film integrated circuits for selective removal of specific layers, comprising the step of:
exposing the multi-layer thin film integrated circuit to a low temperature, low pressure plasma formed from a gaseous multi-component mixture of oxygen, a noble gas carrier and a halogen containing gas selected from the group consisting of:
organohalides defined as having no more than two carbon atoms per molecule and being at least partially substituted by halogens including a pedominance of fluorine atoms, inorganic halides defined as having at least one fluorine atom per molecule, and fluorine gas.

2. A process for etching silicon oxides and silicon nitrides preferentially to single crystal silicons during the manufacture of thin film integrated circuits comprising the step of:
exposing a thin film integrated circuit to a low temperature, low ressure plasma formed from a gaseous multicomponent mixture of oxygen, a noble gas carrier and $CF_4$.

3. A process in accordance with claim 2 wherein the pressure is maintained between 0.5 and 2 torr, wherein the plasma is generated by the application of an RF field with the RF power supplied to the plasma lying within the range of 100 and 350 watts.

4. A process in accordance with claim 2 wherein the noble gas carrier is helium, wherein the helium and oxygen form a binary mixture with 0.5% oxygen and 99.5% helium and wherein the $CF_4$ equals 3% of that binary mixture.

5. The process in accordance with claim 4 wherein the pressure of the plasma equals 0.5 torr and wherein the plasma is generated by the application of RF power to the gaseous mixture at a power level of 250 watts.

6. A process in accordance with cliam 4 wherein the pressure of the plasma equals 0.65 torr and the plasma is generated by the application of an RF field to the gaseous mixture at a power level of 350 watts.

7. A process in accordance with claim 4 wherein the pressure equals 0.8 torr and wherein the plasma is generated by the application of an RF field to the gaseous mixture at an RF power level of 350 watts.

8. A process in accordance with claim 2 wherein the gas carrier is argon.

9. A process in accordance with claim 2 wherein the inert gas carrier is nitrogen.

10. A composition of matter useful in the process for selective etching of silicon oxides and nitrides in the presence of single crystal silicon in a low pressure RF plasma during the manufacture of thin film integrated circuits, comprising:
a gaseous multi-component mixture of oxygen, a noble gas carrier and $CF_4$ wherein the oxygen consists between 0.25 and 6% of the mixture, $CF_4$ constitutes between 0.5 and 7% of the mixture and the balance is one of the group of inert gases including helium, argon, or nitrogen.

11. A composition of matter in accordance with claim 10 wherein the noble gas carrier is helium, and wherein the helium and oxygen form a binary mixture including 0.5% oxygen and 99.5% helium and wherein the $CF_4$ constitutes 3% of said binary mixture.

12. In a composite process for removing photoresist material in the presence of metallic materials without significant degradation of the metallic materials during the manufacture of thin film integrated circuits, the improvement comprising the step of:
exposing the layer of photoresist material to a low temperature, low pressure plasma formed from a gaseous multicomponent mixture at pressures of a few torr of oxygen, a noble gas carrier and a halogen containing gas selected from the group consisting of organohalides defined as having no more than two carbon atoms per molecule and being at least partially substituted by halogens including a predominance of fluorine atoms, inorganic halides defined as having at least one fluorine atom per molecule, and fluorine gas and wherein the oxygen is in the range of 1 to 10% by volume of the noble gas carrier and said oxygen-noble gas components comprise more than 90% by volume of said gaseous multicomponent mixture.

13. In a composite process for removing photoresist material in the presence of metallic materials without significant degradation of the metallic materials during the manufacture of thin film integrated circuits, the improvement comprising the step of:
exposing the layer of photoresist materialto a low temperature, low pressure plasma formed from a gaseous multicomponent mixture at pressures of a few torr of oxygen, organohalide, and noble gas carrier in which the organohalide is selected from a group of organohalides defined as having no more than two carbon atoms per molecule and being at least partially substituted by halogens including a predominance of fluorine atoms, and wherein the oxygen is in the range of 1 to 10% by volume of the noble gas carrier and said oxygen-noble gas components comprise more than 90% by volume of said gaseous multi-component mixture.

14. In a composite process for removing photoresist material in the presence of metallic materials without significant degradation of the metallic materials during the manufacture of thin film integrated circuits, the improvement comprising the step of:
exposing the layer of photoresist material to a low temperature, low pressure plasma formed from a gaseous muticomponent mixture at pressures of a few torr of oxygen, inorganic halide, and a noble gas carrier in which the inorganic halide is selected from a group of halides defined as having at least one fluroine atom per molecule, and wherein the oxygen is in the range of 1 to 10% by volume of the noble gas carrier and said oxygen-noble gas components comprise more than 90% by volume of said gaseous multi-component mixture.

15. In a composite process for removing photoresist material in the presence of metallic materials without significant degradation of the metallic materials during the manufacture of thin film integrated circuits, the improvement comprising the step of:
exposing the layer of photoresist material to a low temperature, low pressure plasma formed from a gaseous multicomponent mixture at pressures of a few torr of oxygen, fluorine and a noble gas carrier, and wherein the oxygen is in the range of 1 to 10% by volume of the noble gas carrier and said oxygen-noble gas components comprise more than 90% by volume of said gaseous multi-component mixture.

16. A process as in claim 2 wherein the defined group of organohalides are fully fluorine substituted.

17. A process as in claim 2 wherein the defined group of organohalides contain at least one hydrogen atom per molecule.

18. A process as in claim 2 wherein each member of the defined group of organohalides contains at least one halogen atom other than fluorine.

19. A process as in claim 2 wherein the defined organohalide constitutes a mixture of organohalides.

20. A process as in claim 3 wherein the defined group of inorganic halides are fully fluorinated.

21. A process as in claim 3 wherein the defined group of inorganic halides contain at least one hydrogen atom per molecule.

22. A process as in claim 3 wherein the defined inorganic halide constitutes a mixture of inorganic halides.

23. In a composite process for removing photoresist material in the presence of metallic material without significant degradation of the metallic material during the manufacture of thin film integrated circuits, the improvement comprising the step of:
   exposing the layer of photoresist material to a low temperature, low pressure plasma formed from a gaseous multicomponent mixture at pressures of a few torr of oxygen, fluorine, organohalide, inorganic halide, and noble gas carrier in which the organohalide is selected from a group of organohalides defined as having no more than two carbon atoms per molecule and being at least partially substituted by halogens including a predominance of fluorine atoms and in which the inorganic halide is selected from a group of halides defined as having at least one fluorine atom per molecule and wherein the oxygen is in the range of 1 to 10% by volume of the noble gas carrier and said oxygen-noble gas components comprise more than 90% by volume of said gaseous multicomponent mixture.

24. A process as in claim 2 wherein the gaseous multicomponent mixture is supplied from a single pressurized source.

25. A process as in claim 3 wherein the gaseous multicomponent mixture is supplied from a single pressurized source.

26. A process as in claim 12 wherein the gaseous multicomponent mixture is supplied from a single pressurized source.

27. A process as in claim 2 wherein the organohalide component is tetrafluoromethane and the noble gas is helium in a range of mixtures from 1 to 10% oxygen, 1 to 10% tetrafluoromethane, balance helium by volume.

28. A process as in claim 16 wherein the noble gas is argon.

29. A process as in claim 2 wherein the organohalide is trifluoromethane and the noble gas is helium in a range of mixtures from 1 to 10% oxygen, 1 to 10% trifluoromethane, balance helium by volume.

30. A process as in claim 18 wherein the noble gas is argon.

31. A process as in claim 4 wherein the noble gas is helium and where the range of mixture is from 1 to 10% oxygen, 1 to 10% fluorine, balance helium by volume.

32. A process as in claim 4 wherein the noble gas is argon and wherein the range of mixtures is from 1 to 10% oxygen, 1 to 10% fluorine, balance argon by volume.

33. A process as in claim 3 wherein the inorganic halide component is gaseous hydrogen fluoride and wherein the mixture includes one of the noble gases helium or argon and wherein the range of mixtures is from 1 to 10% oxygen, 1 to 10% hydrogen fluoride, balance noble gas by volume.

34. A process as in claim 12 wherein the organohalide is tetrafluoromethane, the inorganic halide is fluorine, and the noble gas is helium in a range of mixtures from 1 to 10% oxygen, 1 to 10% tetrafluoromethane, 1 to 10% fluorine, balance helium by volume.

35. A process as in claim 23 wherein the organohalide is trifluoromethane.

36. A process as in claim 23 where the noble gas is argon.

37. A process as in claim 24 where the noble gas is argon.

38. A process as in claim 8 wherein the mixture of organohalides contain tetrafluoromethane and trifluoromethane in a range of mixtures from 1 to 10% oxygen, 1 to 10% tetrafluoromethane, 1 to 10% trifluoromethane, balance helium by volume.

39. A process in claim 27 wherein the noble gas is argon.

40. A process as in claim 12 wherein the organohalide is a mixture of tetrafluoromethane and trifluoromethane and the inorganic halide is fluorine in a range of mixtures from 1 to 10% oxygen, 1 to 10% tetrafluoromethane, 1 to 10% trifluoromethane, 1 to 10% fluorine, balance helium by volume.

41. A process as in claim 29 wherein the noble gas is argon.

42. A composition of matter useful in a process for removing photoresist material in a low temperature, low pessure rf plasma during the manufacture of thin film integrated circuits, comprising,
   a gaseous multicomponent mixture of oxygen, a noble gas carrier and a halogen containing gas selected from the group consisting of; organo halides defined as having no more than two carbon atoms per molecule and being at least partially substituted by halogens including a predominance of fluorine atoms, inorganic halides defined as having at least one fluorine atom per molecule, and fluorine gas and where said oxygen is in the range of 1 to 10% by volume of the noble gas carrier and said oxygen-noble gas components comprise more than 90% by volume of said gaseous multi-component mixture.

43. A composition of matter useful in a process for removing photoresist material in a low temperature, low pressure rf plasma during the manufacture of thin film integrated circuits, comprising:
   a gaseous multi-component mixture of oxygen, organohalide, and noble gas carrier in which the organohalide is selected from a group of organohalides defined as having no more than two carbon atoms per molecule and being at least partially substituted by halogens including a predominance of fluorine atoms and where said oxygen is in the range of 1 to 10% by volume of the noble gas carrier and said oxygen-noble gas components comprise more than 90% by volume of said gaseous multi-components mixture.

44. A composition of matter useful in a process for removing photoresist material in a low temperature, low pressure rf plasma comprising, a ternary mixture of oxygen, inorganic halide, and a noble gas carrier in which the inorganic halide is selected from a group of halides defined as having at least one fluorine atom per molecule and where said oxygen is in the range of 1 to 10% by volume of the noble gas carrier and aid oxygen-noble gas components comprise more than 90% by volume of said gaseous multi-component mixture.

45. A composition as in claim 32 wherein the defined group of organohalides are fully fluorine substituted.

46. A composition as in claim 33 wherein the defined group of inorganic halides are fully fluorinated.

47. A composition as in claim 32 wherein the defined organic halide constitutes a mixture of organic halides.

48. A composition as in claim 33 wherein the defined inorganic halide constitutes a mixture of inorganic halides.

49. A composition of matter useful in a process for removing photoresist material in a low temperature, low pressure rf plasma during the manufacture of thin film integrated circuits, comprising, a gaseous multi-component mixture of oxygen, organohalide, inorganic halide, and noble gas carrier in which the organohalide is selected from a group of organohalides defined as having no more than two carbon atoms per molecule and being at least partially substituted by halogens including a predominance of fluorine atoms and in which the inorganic halide is selected from a group of halides defined as having at least one fluorine atom per molecule and where said oxygen is in the range of 1 to 10% by volume of the noble gas carrier and said oxygen-noble gas components comprise more than 90% by volume of said gaseous multi-component mixture.

50. A composition as in claim 32 wherein the organohalide component is tetrafluoromethane and the range of mixture is from 1 to 10% by volume oxygen, 1 to 10% by volume tetrafluoromethane, balance is selected from the group of noble gases including argon and helium.

51. A composition as in claim 32 wherein the organohalide is trifluoromethane and the noble gas is selected from the group including argon and helium in a range of mixtures from 1 to 10% oxygen, 1 to 10% tetrafluoromethane, balance noble gas by volume.

52. A composition as in claim 33 wherein the inorganic halide component is fluorine gas and the noble gas selected from the group including argon and helium in a range of mixtures from 1 to 10% oxygen, 1 to 10% fluorine, balance noble gas by volume.

53. A composition as in claim 33 wherein the inorganic halide component is gaseous hydrogen fluoride and the noble gas is selected from the group including argon and helium in a range of mixtures from 1 to 10% oxygen, 1 to 10% hydrogen fluoride, balance noble gas by volume.

54. A composition of matter useful in the process for removing photoresist material in a low temperature, low pressure rf plasma during the manufacture of thin film integrated circuits, comprising, a gaseous multi-component mixture of oxygen, tegrafluoromethane and trifluoromethane, and fluorine gas in a range of mixtures from 1 to 10% by volume trifluoromethane, 1 to 10% by volume fluorine and the balance a noble gas selected from the group including helium and argon.

* * * * *

UNITED STATES PATENT AND TRADEMARK OFFICE
CERTIFICATE OF CORRECTION

PATENT NO. : 4,028,155
DATED : June 7, 1977
INVENTOR(S) : Adir Jacob

It is certified that error appears in the above-identified patent and that said Letters Patent are hereby corrected as shown below:

Column 1, line 44 "ramainder" should read --remainder--;

Column 2, line 28 "partical" should read --partial--;

Column 3, line 3 "tetrafloromethane" should read --tetrafluoromethane--;

Column 3, line 24 "sturcture" should read --structure--;

Column 3, line 46 "partically" should read --partially--;

Column 3, line 57 "organo-halide" should read --organohalide--;

Column 4, line 43 "9% helium" should read --94% helium--;

Column 4, line 51 "carbons" should read --carbon--;

Column 4, line 52 "provess of potoresist" should read --process of photoresist--;

Column 5, line 3 insert "a" after "in" and before "sequential";

Column 5, line 63 "pressue" should read --pressure--;

Column 6, line 49 "cyrstal" should read --crystal--;

Column 6, line 52 "o" should read --of--;

Column 6, line 53 "cyrstal" should read --crystal--;

Column 7, line 1 "rages" should read --rates--;

UNITED STATES PATENT AND TRADEMARK OFFICE
CERTIFICATE OF CORRECTION

PATENT NO. : 4,028,155
DATED : June 7, 1977
INVENTOR(S) : Adir Jacob

It is certified that error appears in the above-identified patent and that said Letters Patent are hereby corrected as shown below:

Column 8, line 10 "less" should be underscored;

Column 8, lines 27 & 28 "Single Crystal Silicon Etch Rate a 0.5 torr a 150 W As a function of [$O_2$]" should read --Single Crystal Silicon Etch Rate at 0.5 torr at 150 W As a function of --;

Column 9, line 8 "ressure" should read --pressure--;

Column 9, line 25 "cliam" should read --claim--;

Column 10, line 10 "materialto" should read --material to--;

Column 10, line 34 "fluroine" should read --fluorine--;

Column 12, lines 20 & 21 "organo halides" should read --organohalides--;

Column 14, lines 18 & 19 "tegrafluoromethane" should read --tetrafluoromethane--

Signed and Sealed this

Twenty-seventh Day of December 1977

[SEAL]

Attest:

RUTH C. MASON
Attesting Officer

LUTRELLE F. PARKER
Acting Commissioner of Patents and Trademarks